(12) United States Patent
Wood

(10) Patent No.: US 7,408,410 B2
(45) Date of Patent: Aug. 5, 2008

(54) APPARATUS FOR BIASING A COMPLEMENTARY METAL-OXIDE SEMICONDUCTOR DIFFERENTIAL AMPLIFIER

(75) Inventor: Neil E. Wood, Centreville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 130 days.

(21) Appl. No.: 11/445,754

(22) Filed: Jun. 2, 2006

(65) Prior Publication Data

US 2007/0279132 A1    Dec. 6, 2007

(51) Int. Cl.
*H03F 3/45* (2006.01)

(52) U.S. Cl. .................................. 330/259; 330/261

(58) Field of Classification Search ............... 330/258, 330/259

See application file for complete search history.

(56) References Cited

U.S. PATENT DOCUMENTS

| 4,797,631 | A  | * | 1/1989 | Hsu et al. | 330/253 |
| 6,774,722 | B2 | * | 8/2004 | Hogervorst | 330/258 |
| 7,253,686 | B2 | * | 8/2007 | Ali | 330/259 |

* cited by examiner

*Primary Examiner*—Steven J Mottola
(74) *Attorney, Agent, or Firm*—Daniel J. Long; Antony P. Ng; Dillon & Yudell LLP

(57) ABSTRACT

A bias generation circuit for biasing a differential amplifier is disclosed. The bias generation circuit is coupled to the differential amplifier. After determining a common-mode voltage of a pair of differential outputs from the differential amplifier, the bias generation circuit generates a bias voltage, which is proportional to the determined common-mode voltage, to the differential amplifier such that the common-mode input voltage range of the differential amplifier is extended to as far as the rail-to-rail voltage.

6 Claims, 1 Drawing Sheet

APPARATUS FOR BIASING A COMPLEMENTARY METAL-OXIDE SEMICONDUCTOR DIFFERENTIAL AMPLIFIER

The present invention was made with United States Government support under contract number DTRA01-030D-0007 awarded by Defense Threat Reduction Agency. The United States Government has certain rights in the present invention.

BACKGROUND OF THE INVENTION

1. Technical Field

The present invention relates to differential amplifiers in general, and in particular to complementary metal-oxide semiconductor (CMOS) differential amplifiers. Still more particularly, the present invention relates to an apparatus for biasing a CMOS differential amplifier.

2. Description of Related Art

Differential amplifiers are commonly employed in various electronics applications for providing an output in response to a pair of differential inputs. Differential amplifiers can also be readily adapted to function as an operational amplifier, a sense amplifier, a comparator, etc. Basically, differential amplifiers are utilized where linear amplifications with minimum distortions are desired.

However, differential amplifiers typically can only operate over a relatively narrow range of common-mode input voltages. As a differential amplifier is forced to extend beyond the range of common-mode input voltages, the differential-mode gain drops off sharply.

There are prior art techniques for improving the common-mode input voltage range of differential amplifiers, but such techniques use biasing schemes that are uncompensated for variations in common-mode voltage, supply voltage, temperature, and process. Because of the lack of compensation, the practical common-mode range of the differential inputs is somewhat less than the full rail-to-rail range. In addition, some of the prior art techniques rely on the usage of saturated current sources for biasing differential amplifiers, which can result in a reduction of the bandwidth of the differential amplifiers.

Consequently, it would be desirable to provide an improved apparatus for biasing a differential amplifier such that its common-mode input voltage range can be extended to as far as the rail-to-rail voltage, while maintaining the differential-mode gain of the differential amplifier at a high level.

SUMMARY OF THE INVENTION

In accordance with a preferred embodiment of the present invention, a differential amplifier is coupled to a bias generation circuit. After determining a common-mode voltage of a pair of differential outputs from the differential amplifier, the bias generation circuit generates a bias voltage, which is proportional to the determined common-mode voltage, to the differential amplifier such that the common-mode input voltage range of the differential amplifier is extended to as far as the rail-to-rail voltage.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
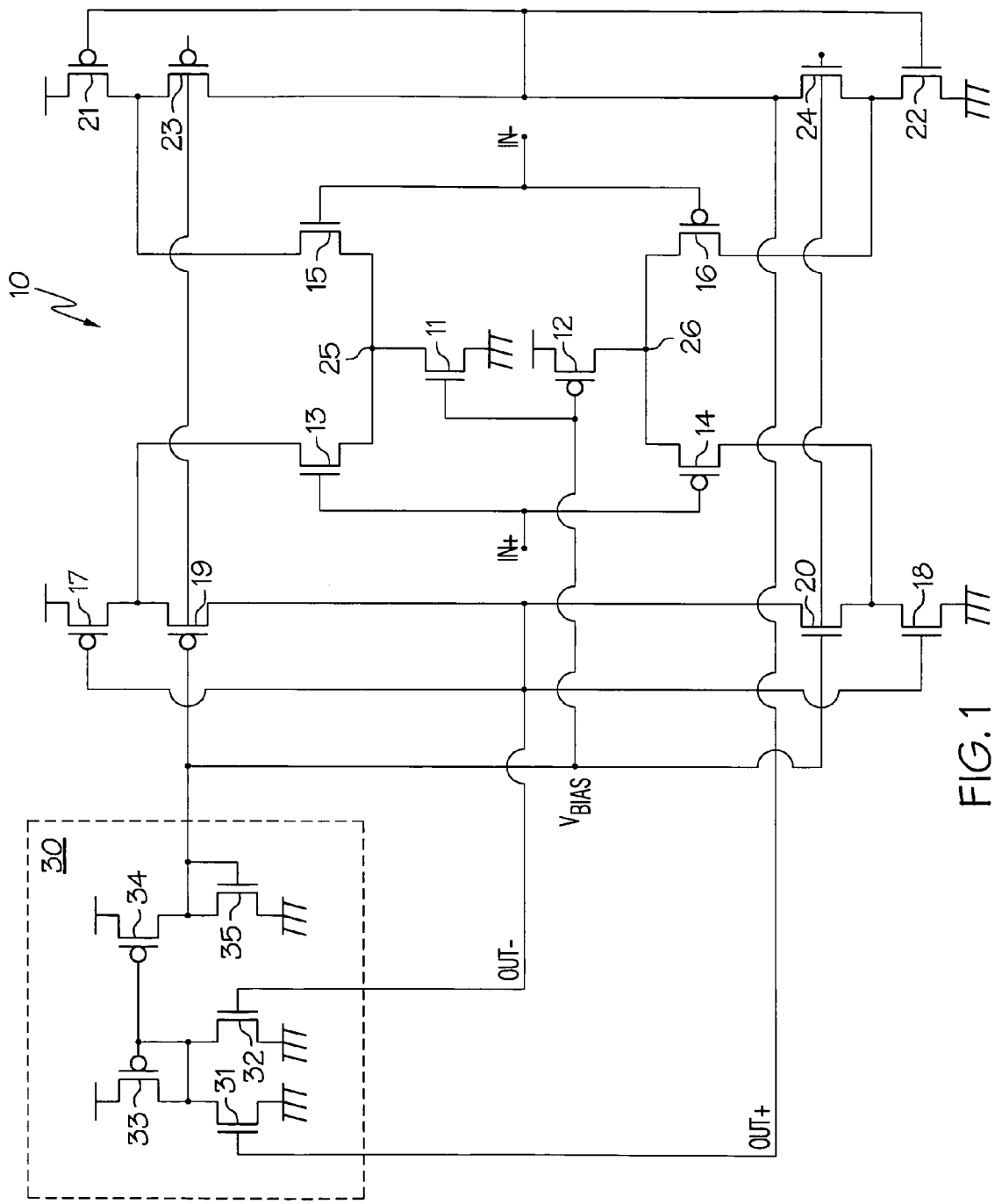
FIG. 1 a schematic diagram of a differential amplifier having a bias generation circuit, in accordance with a preferred embodiment of the present invention.

Referring now to the drawings and in particular to FIG. 1, there is illustrated a schematic diagram of a differential amplifier having a bias generation circuit, in accordance with a preferred embodiment of the present invention. As shown, a bias generation circuit 30 provides a biasing voltage to a differential amplifier 10. With bias generation circuit 30, the differential-mode gain of differential amplifier 10 remains sufficiently high for differential amplifier 10 to be functional over a wide range of common-mode input voltages.

Differential amplifier 10 includes p-channel transistors 12, 14, 16, 17, 19, 21 and 23, and n-channel transistors 11, 13, 15, 18, 20, 22 and 24. Differential amplifier 10 receives a pair of differential voltage inputs at inputs IN+ and IN−, and provides a pair of voltage outputs at outputs OUT+ and OUT−. Differential amplifier 10 is completely complementary because each transistor has a complementary counter part of the opposite conduction type. In addition, differential amplifier 10 is also substantially symmetrical about nodes 25 and 26.

As shown in FIG. 1, transistors 11-12 are at the center of the symmetry. Transistor 12 is coupled between node 26 and a supply voltage $V_{dd}$ (positive rail voltage). Transistor 11 is coupled between node 25 and a supply return $V_{ss}$ or ground (negative rail voltage). With their gates connected together, transistors 11 and 12 operate as a complementary transistor pair.

On the left-side of nodes 25 and 26, transistors 13-14 and 17-18 amplify signals from input IN+. In addition, transistors 17-20 are connected in series between $V_{dd}$ and ground. The source of transistor 17 is connected to $V_{dd}$, and the drain of transistor 17 is connected to the source of transistor 19. The drain of transistor 19 is connected to the source of transistor 20. The drain of transistor 20 is connected to the source of transistor 18, and the drain of transistor 18 is connected to ground. Transistors 13-14 operate as a complementary transistor pair, transistors 17-18 operate as a complementary transistor pair, and transistors 19-20 operate as a complementary transistor pair.

On the right-side of nodes 25 and 26, transistors 15-16 and 21-22 amplify signals from input IN−. In addition, transistors 21-24 are connected in series between $V_{dd}$ and ground. The source of transistor 21 is connected to $V_{dd}$, and the drain of transistor 21 is connected to the source of transistor 23. The drain of transistor 23 is connected to the source of transistor 24. The drain of transistor 24 is connected to the source of transistor 22, and the drain of transistor 22 is connected to ground. Transistors 15-16 operate as a complementary transistor pair, transistors 21-22 operate as a complementary transistor pair, and transistors 23-24 operate as a complementary transistor pair.

The gates of transistors 21-22 are connected to a node between transistors 23-24 to yield output OUT+. The gates of transistors 17-18 are connected to a node between transistors 19-20 to yield output OUT−. The gates of transistors 19-20 and 23-24 are connected to the gates of transistors 11-12 to receive a bias voltage $V_{bias}$ from bias generation circuit 30.

Furthermore, each of transistor pairs 13 and 19, 15 and 23, 14 and 20, and 16 and 24 forms a "folded-cascode" pair. Each of the above-mentioned transistor pairs forms a cascode pair because the drain of the first transistor in the transistor pair is cascaded with the source of the second transistor in the transistor pair in a classical cascode fashion. Each of the above-mentioned transistor pairs is folded since the two transistors in each transistor pair are of opposite conduction type. Therefore, the small-signal current output from the drain of the first transistor in the transistor pair folds around in direction when it enters the source of the second transistor in the transistor pair.

As mentioned above, bias generation circuit 30 provides bias voltage $V_{bias}$ to differential amplifier 10. As shown in FIG. 1, bias generation circuit 30 includes p-channel transistors 33-34, and n-channel transistors 31-32 and 35. The drain of transistor 33 is connected to $V_{dd}$, and the gate and source of transistor 33 are connected to the drains of transistors 31-32. The sources of transistors 31-32 are connected to ground. The gate of transistor 31 is connected to the output OUT+ of differential amplifier 10, and the gate of transistor 32 is connected to the output OUT− of differential amplifier 10.

In addition, transistors 34-35 are connected in series between $V_{dd}$ and ground. The gate of transistor 34 is connected to the gate of transistor 33. The gate and drain of transistor 35 are connected together to provide bias voltage $V_{bias}$ at the gates of transistor pairs 11-12, 19-20 and 23-24 within differential amplifier 10.

Broadly speaking, bias generation circuit 30 calculates the common mode voltage between output signals OUT+ and OUT− for generating bias voltage $V_{bias}$. Specifically, transistors 31-33 generates a common mode signal based on output signals OUT+ and OUT− from differential amplifier 10. In turn, transistors 33-35, which forms a current-mirror configuration, transforms the common mode signal to a bias voltage $V_{bias}$ at the gate and drain of transistor 35. Bias generation circuit 30 operates on a self-biasing scheme that relies on a negative feedback from differential amplifier 10.

As has been described, the present invention provides an improved apparatus for biasing a CMOS differential amplifier. With the present invention, the common-mode input voltage range of the CMOS differential amplifier can be extended to as far as the rail-to-rail voltage.

While the invention has been particularly shown and described with reference to a preferred embodiment, it will be understood by those skilled in the art that various changes in form and detail may be made therein without departing from the spirit and scope of the invention.

What is claimed is:

1. An apparatus comprising:
  a complementary fold-cascode differential amplifier; and
  a bias generation circuit, coupled to said differential amplifier, for determining a common-mode voltage of a pair of differential outputs from said differential amplifier, and generates a bias voltage to said differential amplifier such that the common-mode input voltage range of said differential amplifier is extended to as far as the rail-to-rail voltage.

2. The apparatus of claim 1, wherein said bias voltage is proportional to said common-mode voltage.

3. The apparatus of claim 1, wherein said bias generation circuit includes means for determining a common-mode voltage between two output signals from said differential amplifier.

4. The apparatus of claim 3, wherein said bias generation circuit further includes a current mirror.

5. A bias generation circuit for biasing a differential amplifier, said bias generation circuit comprising:
  means for determining a common-mode voltage between two output signals from said differential amplifier, wherein said differential amplifier is a complementary fold-cascode differential amplifier; and
  a current mirror for converting said determined common mode voltage to a bias voltage for said differential amplifier.

6. The bias generation circuit of claim 5, wherein said bias voltage is proportional to said common-mode voltage.

* * * * *